United States Patent
Takayanagi

(10) Patent No.: US 10,236,868 B2
(45) Date of Patent: Mar. 19, 2019

(54) SEMICONDUCTOR DEVICE

(71) Applicant: Renesas Electronics Corporation, Tokyo (JP)

(72) Inventor: Koji Takayanagi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/934,505

(22) Filed: Mar. 23, 2018

(65) Prior Publication Data
US 2018/0269860 A1 Sep. 20, 2018

Related U.S. Application Data

(63) Continuation of application No. 15/419,798, filed on Jan. 30, 2017, now Pat. No. 9,948,283.

(30) Foreign Application Priority Data

Mar. 22, 2016 (JP) .................. 2016-057403

(51) Int. Cl.
*H03K 3/356* (2006.01)
*H03K 17/10* (2006.01)
*H03K 19/003* (2006.01)

(52) U.S. Cl.
CPC . *H03K 3/356113* (2013.01); *H03K 3/356182* (2013.01); *H03K 17/102* (2013.01); *H03K 19/00315* (2013.01)

(58) Field of Classification Search
CPC .. H03K 17/102; H03K 17/107; H03K 17/161; H03K 17/162; H03K 3/356;
(Continued)

(56) References Cited

U.S. PATENT DOCUMENTS 5,729,155 A 3/1998 Kobatake
8,633,737 B2* 1/2014 Wang .............. H03K 19/00315
327/108

(Continued)

FOREIGN PATENT DOCUMENTS

JP H08-148988 A 6/1996

OTHER PUBLICATIONS

United States Notice of Allowance dated Dec. 13, 2017 in U.S. Appl. No. 15/419,798.

*Primary Examiner* — John W Poos
(74) *Attorney, Agent, or Firm* — McGinn IP Law Group, PLLC.

(57) ABSTRACT

A semiconductor device includes: a semiconductor chip including a level shift circuit to output a high amplitude signal from an input of a logical signal, the level shift circuit including a series coupling circuit coupled to a second power supply, a control circuit coupled to the series coupling circuit for controlling the series coupling circuit based on the logical signal, and a first potential conversion circuit coupled between the series coupling circuit and the control circuit and coupled to a first power supply. The series coupling circuit includes a plurality of first MOS transistors coupled in series between the second power supply and a reference power supply, and a plurality of second MOS transistors coupled in series between the second power supply and the reference power supply in series with the plurality of first MOS transistors.

20 Claims, 10 Drawing Sheets

(58) Field of Classification Search
CPC ....... H03K 3/356017; H03K 3/356113; H03K 5/084; H03K 5/24
USPC .................. 327/108, 109, 110, 111, 112, 333
See application file for complete search history.

(56) References Cited

U.S. PATENT DOCUMENTS

| | | | | |
|---|---|---|---|---|
| 9,837,161 | B2* | 12/2017 | Muller | G11C 16/28 |
| 2005/0184768 | A1* | 8/2005 | Pilling | H03K 19/00315 327/112 |
| 2009/0212832 | A1* | 8/2009 | Hasegawa | H03K 19/017 327/111 |
| 2010/0253392 | A1* | 10/2010 | Ker | H03K 3/0375 327/108 |
| 2010/0264974 | A1* | 10/2010 | Rien | H03K 19/00315 327/313 |
| 2014/0002146 | A1* | 1/2014 | Kim | H03K 17/08104 327/109 |

* cited by examiner

SEMICONDUCTOR DEVICE

CROSS-REFERENCE TO RELATED APPLICATIONS

The present application is a Continuation Application of U.S. patent application Ser. No. 15/419,798, filed on Jan. 30, 2017, which is based on Japanese Patent Application No. 2016-057403 filed on Mar. 22, 2016 including the specification, drawings and abstract and which is incorporated herein by reference in its entirety.

BACKGROUND

The present disclosure relates to a semiconductor device and is applicable to a semiconductor device including a level shift circuit for example.

The level shift circuit converts signal amplitude in each of circuits that operate with different supply voltages into the amplitude corresponding to each supply voltage. For example, in the miniaturized semiconductor integrated circuit, the supply voltage of a low voltage system is employed from the viewpoint of the reduced power consumption of the circuit and the reliability of an element. On the other hand, in an input/output circuit, which inputs and outputs a signal from and to an external circuit, the conventional supply voltage (the supply voltage of a high voltage system) is employed. Therefore, the level shift circuit is needed to convert the signal level in the power supply circuit of the low voltage system inside the integrated circuit into the signal level in the power supply circuit of the high voltage system. Japanese Unexamined Patent Application Publication No. Hei. 8 (1996)-148986 (Patent Literature 1) discloses a technique in which basically, a load element, one conductivity type MOS transistor with a gate bias of about a half of a high voltage, a reverse conductivity type MOS transistor with a similar gate bias of about a half of the high voltage, and a reverse conductivity type MOS transistor with a gate supplied with a logic input of low amplitude are coupled in series in this order between the high voltage and GND, and voltages applied to gate layers of every MOS transistors are all reduced.

SUMMARY

When a high amplitude signal (a high voltage (VPP)) is outputted not employing a transistor having a high withstand voltage structure (employing a transistor having a low withstand voltage structure) as in Japanese Unexamined Patent Application Publication No. Hei 8 (1996)-148988, a drain-to-source voltage (Vds) exceeding a signal of low amplitude (a low voltage (VDD)) may be applied to the transistor.

The other issues and new features of the present invention will become clear from the description of the present specification and the accompanying drawings.

The following explains briefly the outline of a typical embodiment of the present disclosure.

That is, a semiconductor device includes a level shift circuit that outputs a high amplitude signal from the input of a low amplitude logical signal. The level shift circuit includes a series coupling circuit, a first gate control circuit coupled to a first power supply, a second gate control circuit coupled to a second power supply of a potential higher than the potential of the first power supply, and a potential conversion circuit arranged between the first gate control circuit and the series coupling circuit. The potential conversion circuit supplies a first level potential, which is lower than the potential of the first power supply and higher than the potential of a reference power supply, to a gate of an N-channel MOS transistor of the series coupling circuit.

According to the semiconductor device described above, it is possible to reduce the drain-to-source voltage of the transistor.

DETAILED DESCRIPTION

Figure 1:
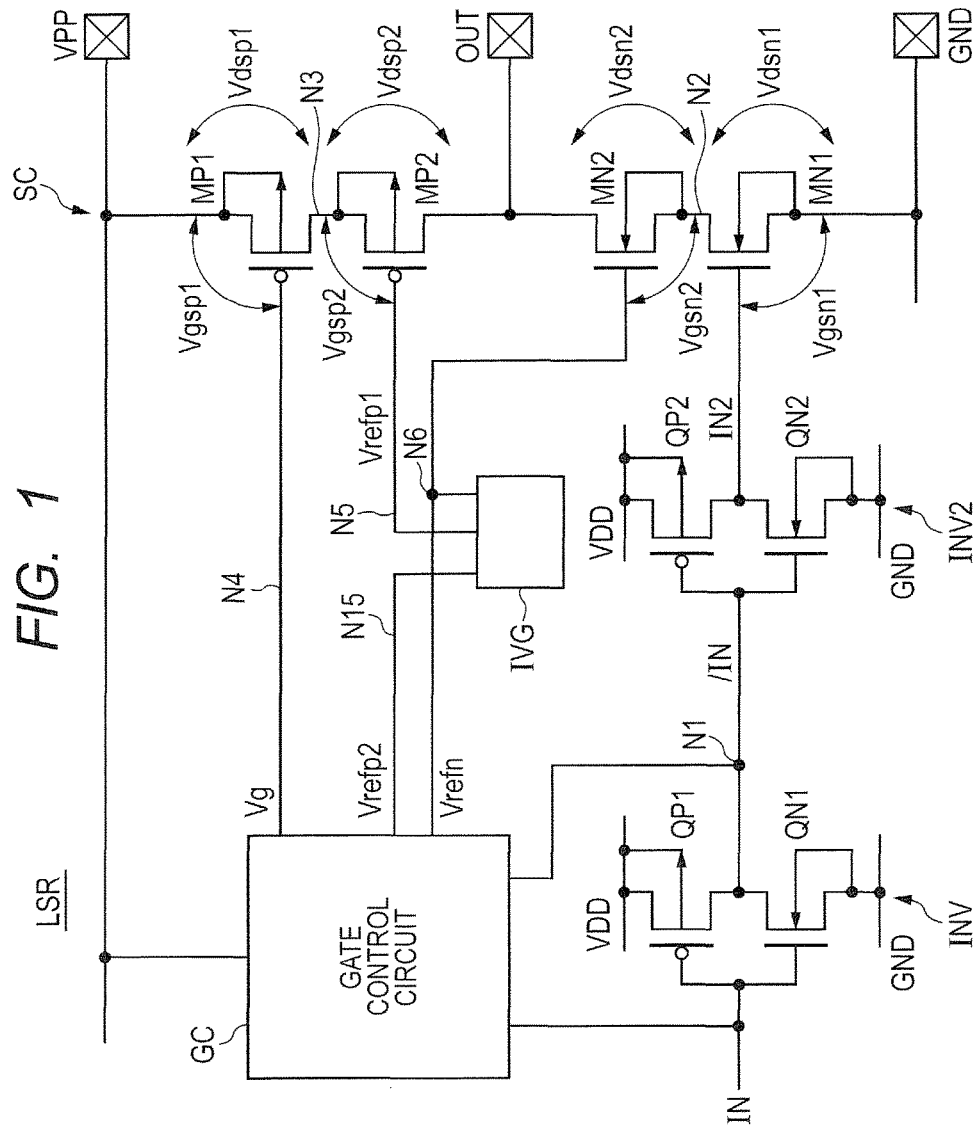
FIG. 1 is a circuit diagram illustrating a level shift circuit according to a comparative example.

Hereinafter, a comparative example and embodiments are explained with reference to drawings. In the following explanation, the same symbol or reference numeral is attached to the same element and the repeated explanation thereof may be omitted.

The inventors of the present invention have examined the technology (called hereinafter a comparative example) in which a signal of a high amplitude (0 V to VPP) is outputted from the input of a logical signal of a low amplitude (0 V to VDD), without employing a transistor of a high withstand voltage structure and preventing an excessive voltage from being applied to a gate oxide layer of the transistor. FIG. 1 is a circuit diagram illustrating a level shift circuit according to the comparative example.

The level shift circuit LSR according to the comparative example includes inverters INV and INV2, a gate control circuit GC, an intermediate potential generating circuit IVG, and a series circuit SC. The inverter INV serving as a gate control circuit is comprised of a P-channel MOS transistor (called hereinafter "PMOS transistor") QP1 and an N-channel MOS transistor (called hereinafter "NMS transistor") QN1 that are coupled in series between a low power supply potential (VDD) and a ground potential (GND). A gate of the PMOS transistor QP1 and a gate of the NMOS transistor QN1 are coupled to the input signal (IN). The IN is a low amplitude signal from 0 V to VDD. The inverter INV2 serving as a gate control circuit is comprised of a PMOS transistor QP2 and an NMOS transistor ON2 that are coupled in series between the low power supply potential (VDD) and the ground potential (GND). A gate of the PMOS transistor QP2 and a gate of the NMOS transistor QN2 are coupled to the inverted signal (/IN). The inverter INV2 generates a first signal (IN2).

The gate control circuit GC generates a second signal (Vg). The details will be described later. The intermediate potential generating circuit IVG generates a first potential (Vrefp1), a second potential (Vrefp2), and a third potential (Vrefn). The details will be described later.

The series circuit SC is comprised of a PMOS transistor MP1, a PMOS transistor MP2, an NMOS transistor MN2, and an NMOS transistor MN1 that are coupled in series between a high power supply potential (VPP) and the ground potential (GND). The second signal (Vg) is applied to a gate of the PMOS transistor MP1. The first potential (Vrefp1) is applied to a gate of the PMOS transistor MP2. The second potential (Vrefn) is applied to a gate of the NMOS transistor MN2. The first signal (IN2) as an output signal of the inverter INV2 is applied to a gate of the NMOS transistor MN1. The second signal (Vg) is a signal having a potential VPP/2 to VPP. The first potential (Vrefp1) and the third potential (Vrefn) are a potential of about VPP/2. A substrate electrode of the PMOS transistor MP1 is coupled to the high power supply potential (VPP), and a substrate electrode of the NMOS transistor MN1 is coupled to the ground potential (GND). A substrate electrode of the PMOS transistor MP2 is coupled to a source of the PMOS transistor MP2. A substrate electrode of the NMOS transistor MN2 coupled to a source of the NMOS transistor MN2. An output signal (OUT) is pulled out from a connection node of the PMOS transistor MP2 and the NMOS transistor MN2.

The transistor coupled between the low power supply potential (VDD) and the ground potential (GND) and the transistor coupled between the high power supply potential (VPP) and the ground potential (GND) are a low withstand voltage device formed in the same process. In other words, the withstand voltage of the transistor that composes the inverter INV and the withstand voltage of the transistor that composes the series circuit SC are comparable, and the withstand voltage of each transistor is higher than VDD but lower than VPP. For example, VDD is 1.8 V, VPP is 3.3 V, and GND is 0 V.

Figure 2:
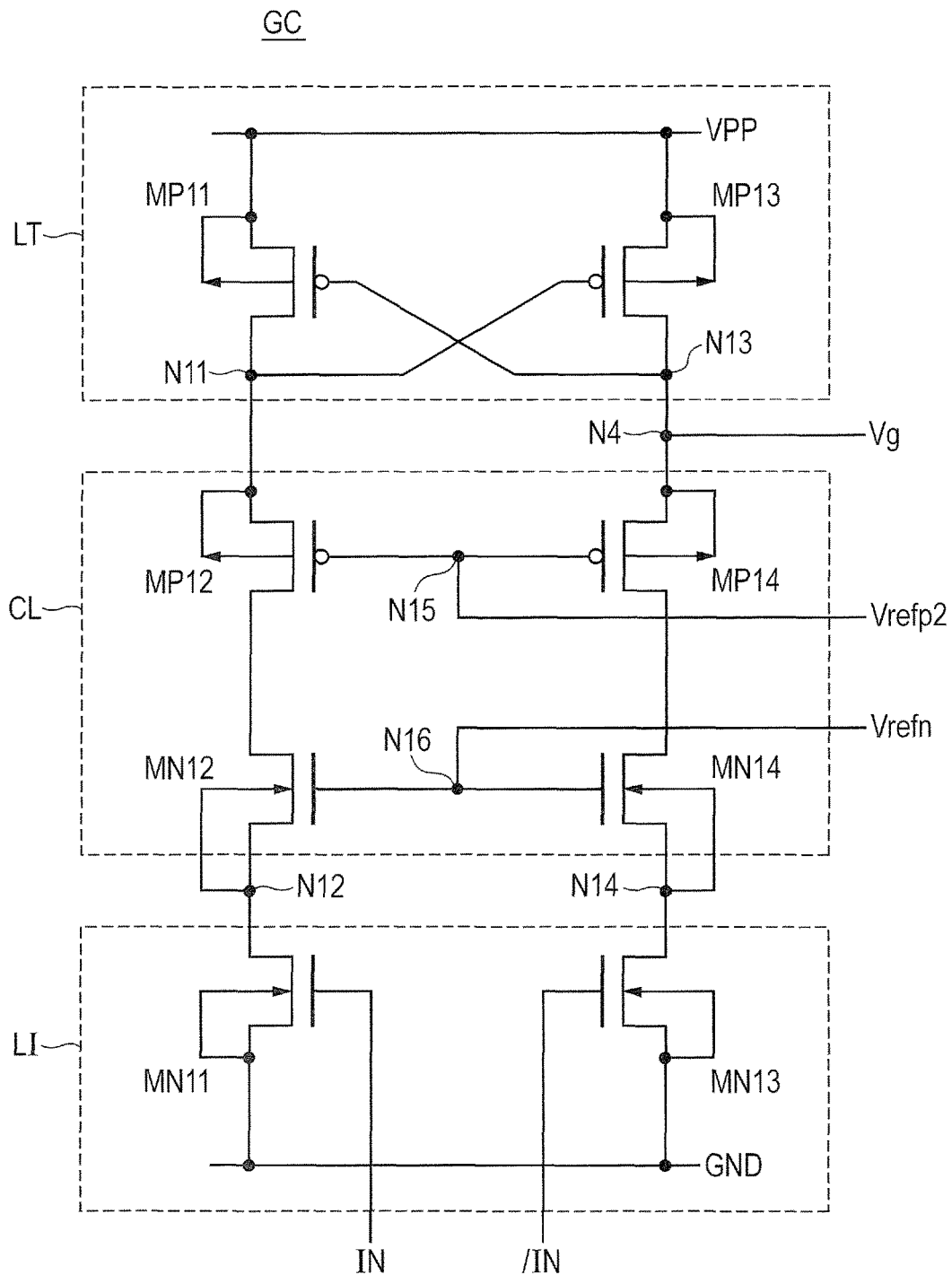
FIG. 2 is a circuit diagram illustrating a gate control circuit.

FIG. 2 is a circuit diagram illustrating a gate control circuit. In the gate control circuit GC, a series circuit is provided between the high power supply potential (VPP) and the ground potential (GNU). The series circuit is comprised of a PMOS transistor MP11, a PMOS transistor MP12 of which a gate is supplied with the second potential (Vrefp2), an NMOS transistor MN12 of which a gate is supplied with the third potential (Vrefn) and an NMOS transistor MN11 of which a gate is supplied with the input signal (IN), all coupling in series.

Moreover, in the gate control circuit GC, another series circuit is provided between the high power supply potential (VPP) and the ground potential (GND). The another series circuit is comprised of a PMOS transistor MP13, a PMOS transistor MP14 of which a gate is supplied with the second potential (Vrefp2), an NMOS transistor MN14 of which a gate is supplied with the third potential (Vrefn), and an NMOS transistor MN13 of which a gate is supplied with the inverted signal (/IN), all coupling in series.

A gate of the PMOS transistor MP11 is coupled to a node N13 that s a connection node of the PMOS transistor MP13 and the PMOS transistor MP14, A gate of the PMOS transistor MP13 is coupled to a node N11 that is a connection node of the PMOS transistor MP11 and the PMOS transistor MP12. At the same time, substrate electrodes of the PMOS transistors MP11 and MP13 are coupled to VPP. Substrate electrodes of the NMOS transistors MN11 and MN13 are coupled to GND. Substrate electrodes of the PMOS transistors MP12 and MP14 are coupled to sources of the PMOS transistors MP12 and MP14, respectively. Substrate electrodes of the NMOS transistors MN12 and MN14 are coupled to sources of the NMOS transistors MN12 and MN14, respectively. The gate potential (Vg) is pulled out from a node N4 coupled to the node N13. By setting Vrefp2=VPP/2−|Vtp|, Vg becomes a potential of an amplitude lying between VPP/2 and VPP.

A latch circuit LT is comprised of the PMOS transistor MP11 and the PMOS transistor MP13 by cross-coupling the respective gates and drains; accordingly, a stationary current can be cut off.

A clamping circuit CL is comprised of the PMOS transistors MP12 and MP14, and the NMOS transistors MN12 and MN14. The drain potential of the PMOS transistors MP11 and MP13 descends only to Vrefp2 by the action of the clamping circuit CL. The drain potential of the NMOS transistors MN11 and MN13 rises only to Vrefn by the action of the clamping circuit CL.

A latch inverting circuit LI is comprised of the NMOS transistors MN11 and MN13, and the state of the latch circuit LT can be inverted based on the input signal (IN) and the inverted signal (/IN).

Figure 3:
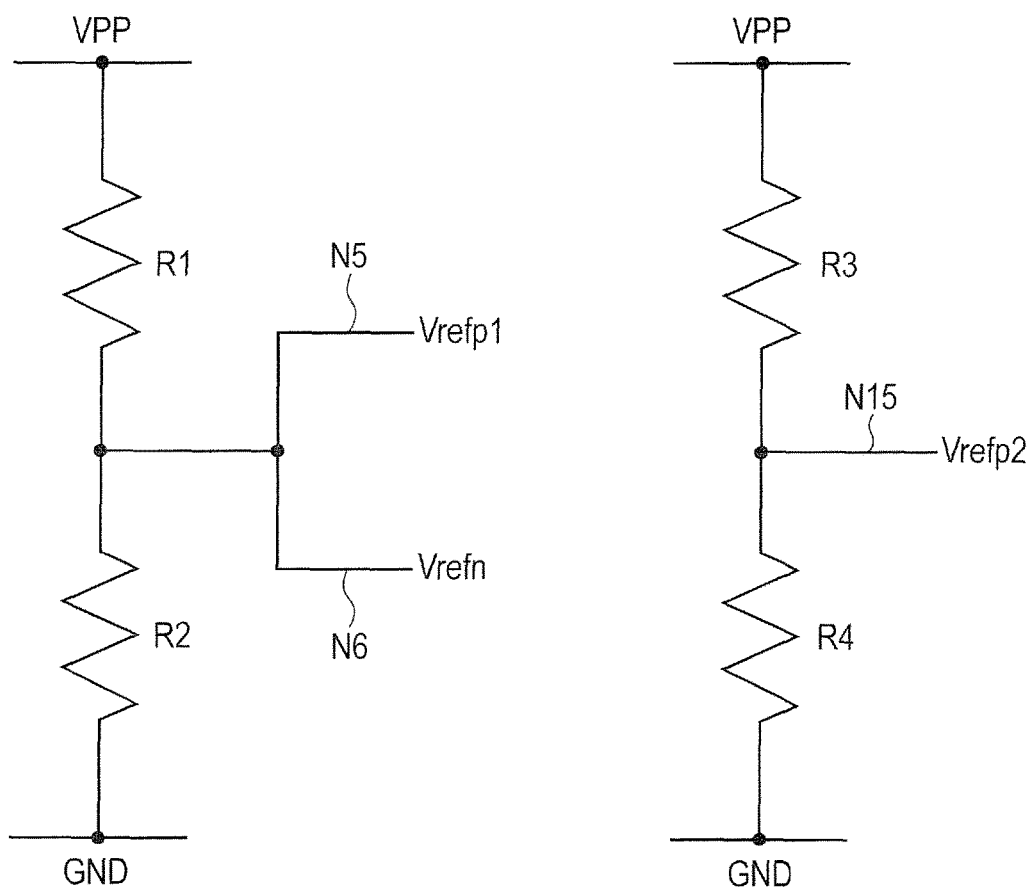
FIG. 3 is a circuit diagram illustrating an intermediate potential generating circuit.

FIG. 3 is a circuit diagram illustrating the intermediate potential generating circuit. In the intermediate potential generating circuit IVG, a resistive element R1 and a resistive element R2 are coupled in series between the high power supply potential (VPP) and the ground potential (GND) and the first potential (Vrefp1) and the third potential (Vrefn) are pulled out from a connection node of the resistive element R1 and the resistive element R2. Assuming that the value of resistance of the resistive element R1 is r1 and the value of resistance of the resistive element R2 is r2, the value of the first potential (Vrefp1) and the third potential (Vrefn) is given by the following equation (1).

$$Vrefp1 = Vrefn = r2/(r1+r2) \qquad (1)$$

In the present embodiment, it is defined as Vrefp1=Vrefn however, it may be defined as Vrefp1≠Vrefn as long as they are a voltage around VPP/2. In the intermediate potential generating circuit a resistive element R3 and a resistive element R4 are coupled in series between the high power supply potential (VPP) and the ground potential (GND), and the second potential (Vrefp2) is pulled out from a connection node of the resistive element R3 and the resistive element R4. Assuming that the value of resistance of the resistive element R3 is r3 and the value of resistance of the resistive element: R4 is r4, the value of the second potential (Vrefp2) is given by the following equation (2).

$$Vrefp2 = r4/(r3+r4) \qquad (2)$$

The resistive elements R1, R2, R3, and R4 may be formed by a PMOS transistor or an NMOS transistor.

Next, the operation is explained. Here, it is assumed that "H" is the low power supply potential (VDD) "HH" is the high power supply potential (VPP), and "L" is the ground potential (GND). The ground potential is also called a reference potential.

First, when the input signal (IN) is "L", the node N1 becomes "H" and the NMOS transistor MN1 is turned off. At the same time, the output node N4 of the gate control circuit GC is Vrefp2+|Vtp|; accordingly, if (VPP−Vrefp2−|Vtp|)>|Vtp|, the PHS transistor MP1 is turned on, and the node N3, which is the connection node of the PMOS transistor MP1 and the PMOS transistor MP2, is pulled up to "HH." If (VPP−Vrefp1)>|Vtp|, the PMOS transistor MP2 is also turned on, the output signal (OUT) also set as "HH", and the node N2, which is the connection node of the NMOS transistor MN1 and the NMOS transistor MN2, is pulled up to (Vrefn−Vtn) and stabilized, via the NMOS transistor MN2.

When the input signal (IN) is "H" on the other hand, the node Ni becomes "L", the NMOS transistor MN1 is turned on, and the node N2, which is the connection node of the NMOS transistor MN1 and the NMOS transistor MN2, is pulled down to "L." If Vrefn>Vtn, the NMOS transistor MN2 is also turned on, and the output signal (OUT) also set as "L." Furthermore, the output node N4 is "HH." Accordingly, the PMOS transistor MP1 is turned off, and the node N3 is pull down to (Vrefp1+|Vtp|) and stabilized, via the PMOS transistor MP2.

As explained above, according to the comparative example illustrated in FIG. 1, by controlling the high voltage from the input signal (IN) that swings between VDD and GND, it is possible to obtain the cutout signal (OUT) "L" and "HH." The voltage at the highest (VPP−Vrefp2−|Vtp|) is applied between the drain and the source of the PMOS transistor MP1. The voltage at the highest (Vrefp1+|Vtp|) is applied between the drain and the source of the PMOS transistor MP2. The voltage at the highest (Vrefn−Vtn) is applied between the drain and the source of the NMOS transistor MN1. The voltage at the highest (VPP−Vrefn+Vtn) is applied between the drain and the source of the NMOS transistor MN2 . By setting Vrefp1 and Vrefn as a voltage around VPP/2, it is possible to avoid the case where the high voltage (VPP) applied between the drain and the source of the MOS transistors.

The voltage at the highest (VPP−Vrefp2−|Vtp|) is applied to the crate oxide layer of the PMOS transistor MP1. The voltage at the highest (VPP−Vrefp1) is applied to the gate oxide layer of the PMOS transistor MP2. The voltage at the highest VDD is applied to the gate oxide layer of the NMOS transistor MN1. The voltage of the highest Vrefn is applied to the gate oxide layer of the NMOS transistor MN2. By setting Vrefp1 and Vrefn as a voltage around VPP/2, it is possible to avoid the case where a strong electric field is applied to the gate oxide layer of the MOS transistor.

According to these devices, it becomes unnecessary to manufacture the PMOS transistors MP1 and MP2 and the NMOS transistors MN1 and MN2, with a high withstand voltage structure. Accordingly, it is possible to alleviate the problem that the manufacturing process becomes complicated and that the production cost increases.

However, when the output signal (OUT) makes a transition from "HH" to "L", the output signal (IN2) of the inverter INV2 becomes "H"; accordingly, Vgsn1 becomes as Vgsn1=VDD. The potential of the node N2 becomes Vdsn1. Vgsn2 is given by Vrefn−Vdsn1, and Vgsn2=VPP/2−Vdsn1 is obtained when Vrefn=VPP/2. When it is assumed that VPP−3.3 V and VDD=1.8 V as an example of actual use, Vgsn2 and Vgsn1 are given by Vgsn2=1.65 V Vdsn1 and Vgsn1=1.8 V, and Vgsn2<Vgsn1 is obtained. Accordingly, the on-resistance of the NMOS transistor MN2 becomes greater than the on-resistance of the NMOS transistor MN1, and Vdsn2>Vdsn1 is obtained. Accordingly, the drain-to-source voltage of the NMOS transistor MN2 becomes large. Vdsn2 is given by Vdsn2=VPP−Vdsn1=3.3 V−Vdsn1=1.8 V+1.5 V−Vdsn1=VDD+1.5 V−Vdsn1, and when Vdsn1 becomes as Vdsn1<1.5 V, Vdsn2>VDD is obtained.

When the output signal (OUT) makes a transition from "L" to "HH", the node N4 is at Vrefp2+|Vtp|, and Vgsp1=VPP−Vrefp2−|Vtp| is obtained. When Vrefp2=VPP/2−|Vtp|, Vgsp1=VPP/2 is obtained. The potential of the node N3 becomes as VPP−Vdsp1. Vgsp2 is given by (VPP−Vdsp1)−Vrefp1, and Vgsp2=VPP/2−Vdsp1 is obtained when Vrefp1=VPP/2. When it is assumed that VPP=3.3 V and VDD=1.8 V as an example of actual use, Vgsp2 and Vgsp1 are given by Vgsp2=1.65 V−Vdsp1 and Vgsp1−1.65 V, and Vdsp1>0 V is obtained; accordingly, Vgsp2<Vgsp1 is obtained, Accordingly, the on-resistance of the PMOS transistor MP2 becomes greater than the on-resistance of the PMOS transistor MP1, and Vdsp2>Vdsp1 is obtained. Accordingly, the drain-to-source voltage of the PMOS transistor MP2 becomes large, Vdsp2 is given by Vdsp2=VPP−Vdsp1=3.3 V−Vdsp1=1.8 V+1.5 V−Vdsp1=VDD+1.5 V−Vdsp1, and when Vds1<1.5 V, Vdsp2>VDD is obtained.

Generally, the relation between the hot carrier (HCI) degradation and Vds is expressed by the following Equation (3).

$$\text{HCI degradation} \propto \exp(-y/Vds) \qquad (3)$$

That is, when Vdsn2 is large, the hot carrier degradation of the NMOS transistor MN2 increases exponentially. Particularly in the circuit described above, low withstand voltage transistors are employed and the signal of high amplitude is outputted. Accordingly, Vds exceeding VDD may be applied as described above and the degradation becomes severe

EMBODIMENTS

The means that makes Vgsn1 low (the potential conversion circuit that makes low the output potential of the inverter INV) is provided between the inverter INV as the gate control circuit and the gate of the N-channel MOS transistor MN1. The means that makes Vgsp1 low (the potential conversion circuit that makes high the output potential of the gate control circuit GC) is provided between the gate control circuit GC and the gate of the P-channel MOS transistor MP1. Accordingly, when it is set as Vgsn1≈Vgsn2 and Vgsp1≈Vgsp2, Vdsn1≈Vdsn2≈VPP/2=1.65 V<1.8 V=VDD and Vdsp1≈Vdsp2≈VPP/2=1.65 V<1.8 V−VDD are obtained. Accordingly, it is possible to make low Vdsn2 and Vdsp2.

Embodiment 1

Figure 4:
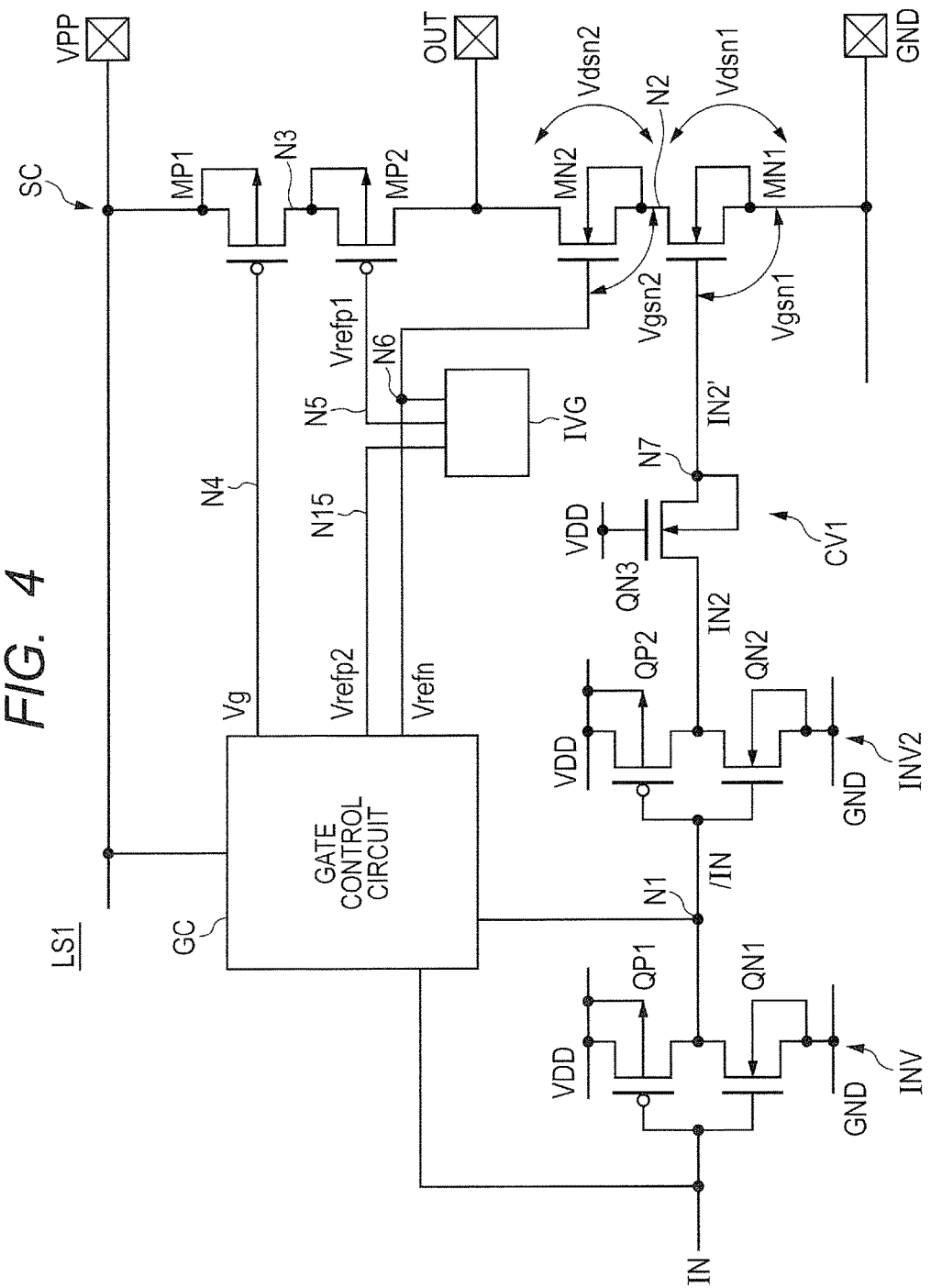
FIG. 4 is a circuit diagram illustrating a level shift circuit according to Embodiment 1.

FIG. 4 is a circuit diagram illustrating a level shift circuit according to Embodiment 1. The level shift circuit LS1 is the same as the level shift circuit LSR, except that a potential conversion circuit CV1 is added between the output of the inverter INV2 and the gate of the NMOS transistor MN1. The potential conversion circuit CV1 is comprised of an NMOS transistor QN3 (an NMOS transfer gate). The NMOS transistor QN3 separates the output potential from the input potential. VDD is applied to a gate of the NMOS transistor QN3, and a substrate electrode of the NMOS transistor QN3 is coupled to the gate of the NMOS transistor MN1 (a node N7). The amplitude of the output of the inverter INV2 is 0 to VDD, and the amplitude in the transient state of the node N7 via the NMOS transistor QN3 lies between 0 and (VDD−Vtn). Here, Vtn is a threshold value of the NMOS transistor QN3. Therefore, Vgsn1 when the NMOS transistor MN1 is turned on becomes VDD−Vtn, smaller than the comparative example by Vtn. When Vgsn1 becomes small, the on-resistance of the NMOS transistor MN1 becomes high, and Vdsn1 becomes large. The potential of the node N2 is decided by the subdivided voltage of the NMOS transistor MN1 and the NMOS transistor MN2. Accordingly, when Vdsn1 becomes large, Vdsn2 becomes small. From the relation of the above-described Equation (3), when Vdsn2 becomes small, the hot carrier degradation of the NMOS transistor MN2 can be suppressed. In the series circuit SC, the substrate electrode of the PMOS transistor MP2 is coupled to the source of the PMOS transistor MP2, and the substrate electrode of the NMOS transistor MN2 is coupled to the source of the NMOS transistor MN2. However, it may be configured such that the substrate electrode of the PMOS transistor MP2 is coupled to the high power supply potential (VPP), and the substrate electrode of the NMOS transistor MN2 is coupled to the ground potential (GND). The modification of the configuration of the series circuit is applicable also to the following Embodiments 2 to 5. In the gate control circuit GC, the substrate electrodes of the PMOS transistors MP12 and MP14 are coupled to the sources of the PMOS transistors MP12 and MP14, respectively, and the substrate electrodes of the NMOS transistors MN12 and MN14 are coupled to the sources of the NMOS transistors MN12 and MN14, respectively. However, it may be configured such that the substrate electrodes of the PMOS transistors MP12 and MP14 are coupled to VPP, respectively, and the substrate electrodes of the NMOS transistors MN12 and MN14 are coupled to GND, respectively. The modification of the configuration of the gate control circuit is applicable also to the following Embodiments 2 to 5.

Figure 5:
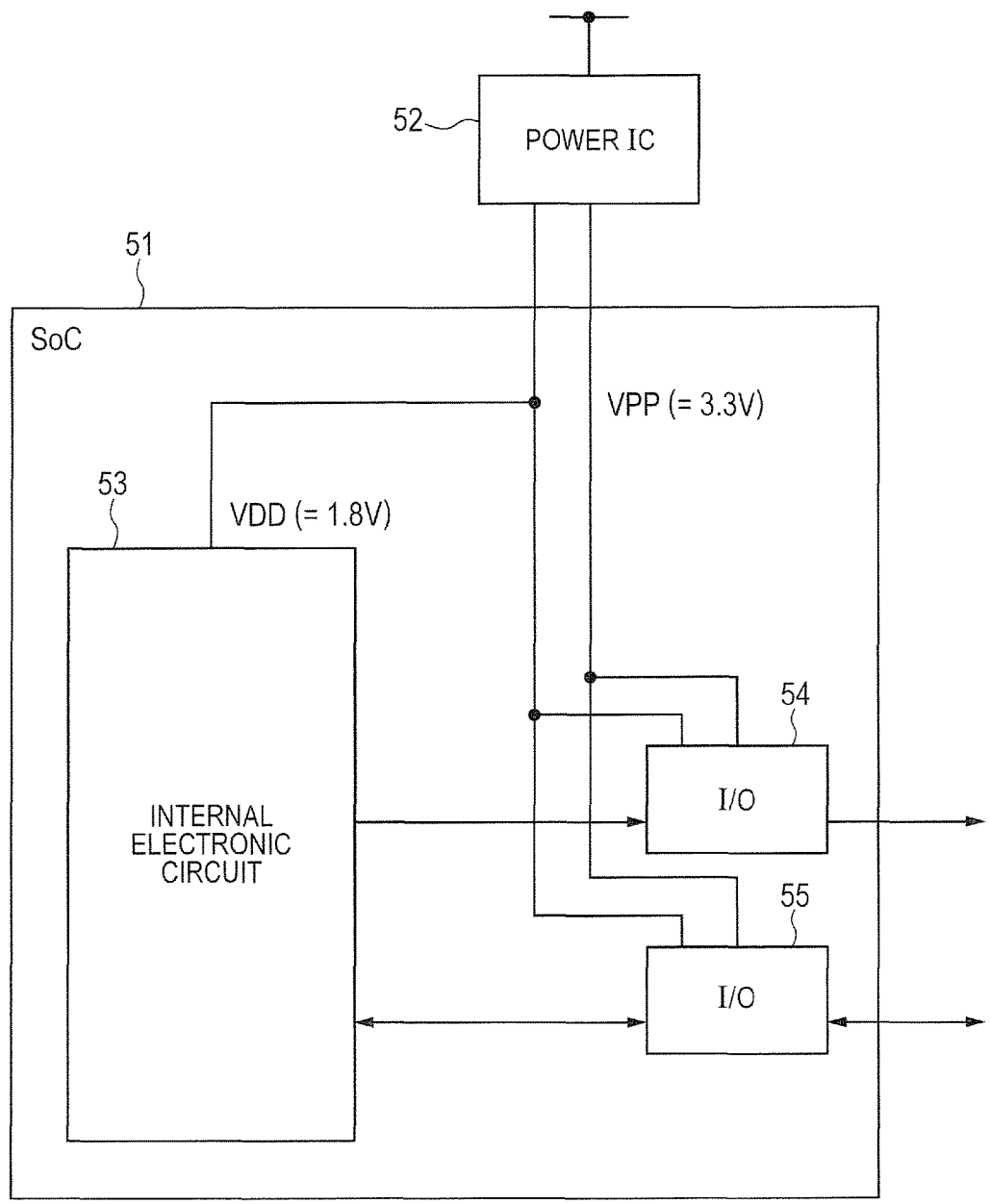
FIG. 5 is a block diagram illustrating a semiconductor device according to Embodiment 1.

FIG. 5 is a block diagram illustrating a semiconductor device according to Embodiment 1. A semiconductor device 50 includes an SoC 51 as a semiconductor device and a power IC 52. The SoC 51 includes an internal electronic circuit 53 and I/O circuits 54 and 55 on one semiconductor. substrate (semiconductor chip). The level shift circuit LS1 is employed for the output circuit of the I/O circuits 54 and 55. In the present embodiment, the I/O circuit 54 operates as an output circuit and the I/O circuit 55 operates as an input circuit and an output circuit. A high power supply potential (VPP=3.3 V) and a low power supply potential (VDD) are supplied from the power IC 52 to the I/O circuits 54 and 55 of the SoC 51. The signal outputted from the internal electronic circuit 53 has the amplitude lying between 0 V and VDD and is supplied to the I/O circuits 54 and 55. The signal of the amplitude lying between 0 V and VDD is converted into the signal lying between 0 V and VPP by the level shift circuit LS1 of the I/O circuits 54 and 55, and outputted to the external of the SoC 51.

Embodiment 2

Figure 6:
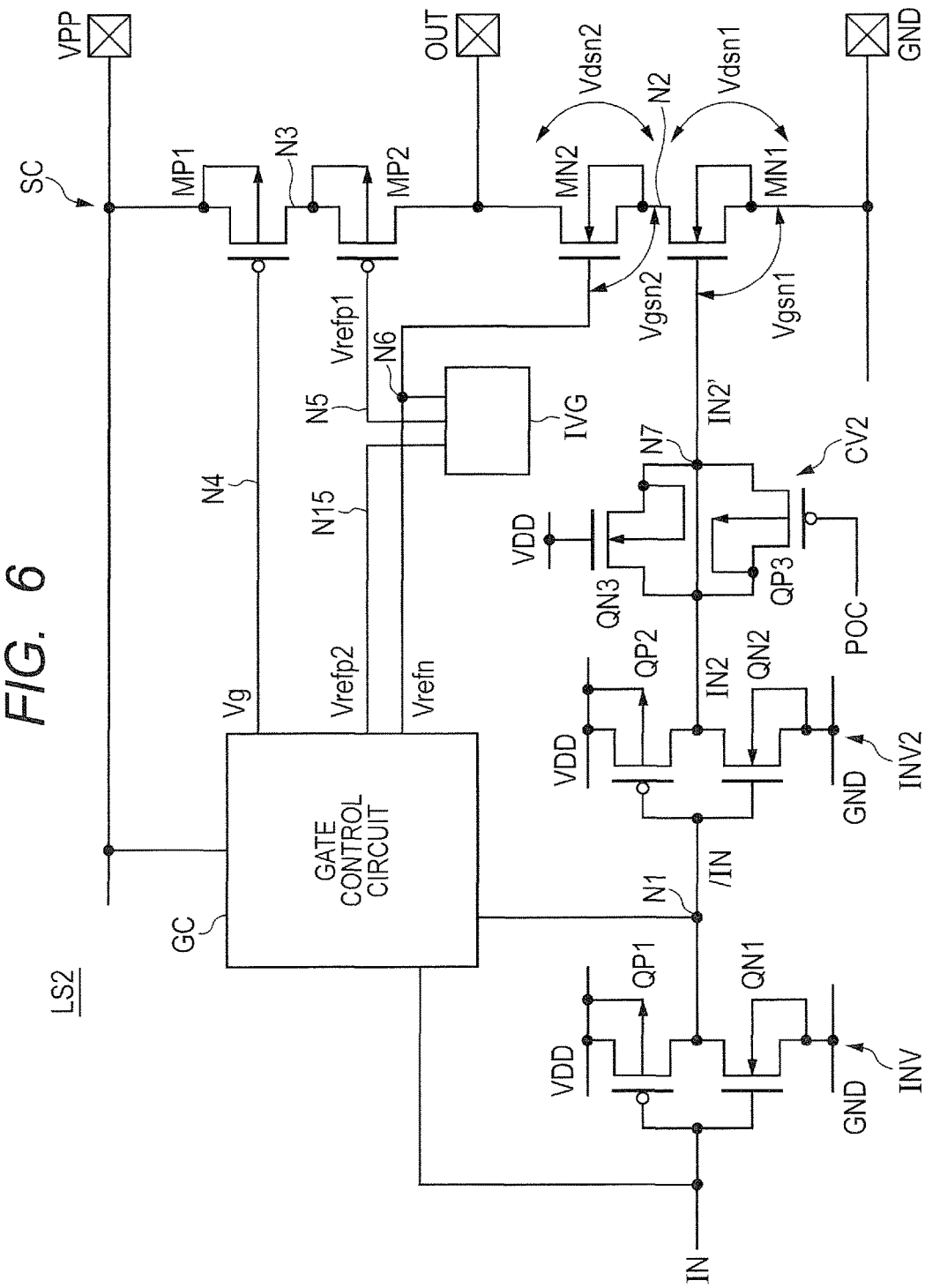
FIG. 6 is a circuit diagram illustrating a level shift circuit according to Embodiment 2.

FIG. 6 is a circuit diagram illustrating a level shift circuit according to Embodiment 2. The level shift circuit LS2 according to Embodiment 2 satisfies both of the suppression of the hot carrier degradation when the high power supply potential (VPP) is high, and the high-speed operation when VPP is low (to the degree not exceeding the withstand voltage of the MOS transistor). The level shift circuit LS2 is the same as the level shift circuit LS1 except for the potential conversion circuit. The potential conversion circuit CVP includes a PMOS transistor QP3 (a PMOS transfer gate) that is coupled in parallel with the NMOS transistor QN3. A POC signal is applied to a gate of the PMOS transistor QP3, and a substrate electrode of the PMOS transistor QP3 is couple to the output of the inverter INV2. When VPP is high, the POC signal is set to "H" (VDD) and the PMOS transistor QP3 is turned of In that case, the circuit operation is the same as that of Embodiment 1. When the "H" level of the node N7 becomes as (VDD−Vtn), the hot carrier degradation of the NMOS transistor QN2 can be suppressed, as in Embodiment 1. When VPP is low, the POD signal is set to "L" (GND) and the PMOS transistor QP3 is turned on. Accordingly, the "H" level of the node N7 becomes as VDD and the amplitude lies between 0 V and VDD; accordingly, the high-speed operation becomes possible.

Figure 7:
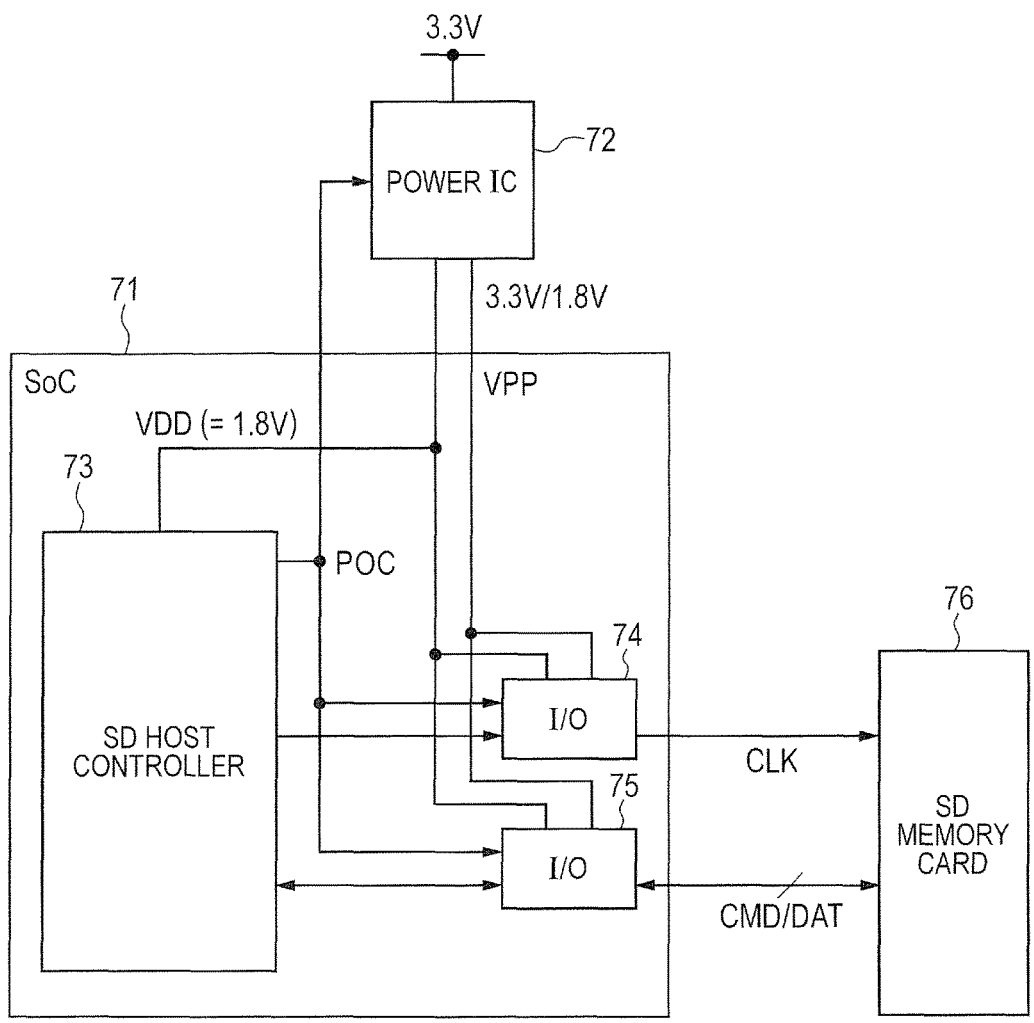
FIG. 7 is a block diagram illustrating information equipment according to Embodiment 2.

FIG. 7 is a block diagram illustrating information equipment according to Embodiment 2. The information equipment 70 includes an SoC 71 as a semiconductor device, a power IC 72, and an SD memory card 76. The SoC 71 includes an SD host controller 73 and I/O circuits 74 and 75 over one semiconductor substrate (a semiconductor chip). The SD host controller 73 acts for exchanging data and a control signal between a CPU (not shown) and the SD memory card 76, outputs a clock signal (CLK) and a command (CMD) for example, and sends and receives data (DAT). The level shift circuit LS2 is employed for the output circuit of the I/O circuits 74 and 75. In the present embodiment, the I/O circuit 74 operates as an output circuit and the I/O circuit 75 operates as an input circuit and an output circuit. The high power supply potential (VPP=3.3 V or 1.8 V) is supplied from the power IC 72 to the I/O circuits 74 and 75 of the SoC 71. The low power supply potential (VDD=1.8 V) is supplied from the power IC 72 to the SD host controller 73 and the I/O circuits 74 and 75. The power IC 72 supplies 1.8 V when the POC signal is "L", and supplies 3.3 V when the POC signal is "H." The signal outputted from the SD host controller 73 has the amplitude lying between 0 V and VDD and is supplied to the I/O circuits 74 and 75. The power IC 72 may be built in the SoC 71.

The exchange of signals between the SoC 71 and the SD memory card 76 uses two modes, a 3.3 V level and a 1.8 V level The low speed operation is preformed on the 3.3 V level and the high-speed operation is preformed on the 1.8 V level. For example, according to the SD memory card standard 3.0, when the supply voltage is 3.3 V, the operation is performed at a maximum frequency of 50 MHz, and when the supply voltage is 1.8 V, the operation is performed at a maximum frequency of 208 MHz. Accordingly, a high-speed operation is required more for the supply voltage at 1.8 V. The power supply potential (VPP) of the SoC 71 is supplied with 3.3 V or 1.8 V from the power IC 72. The switching between 3.3 V and 1.8 V of the output power supply potential of the power IC 72 is performed. by the FOC signal on the side of the SoC 71. The switching of the operation mode between the 3.3 V level and the 1.8 V level of the I/O circuits 74 and 75 is also performed by the control signal POD. At the 1.8 V level, the circuit is switched so that the I/O circuits 74 and 75 may perform the high-speed operation.

Embodiment 3

Figure 8:
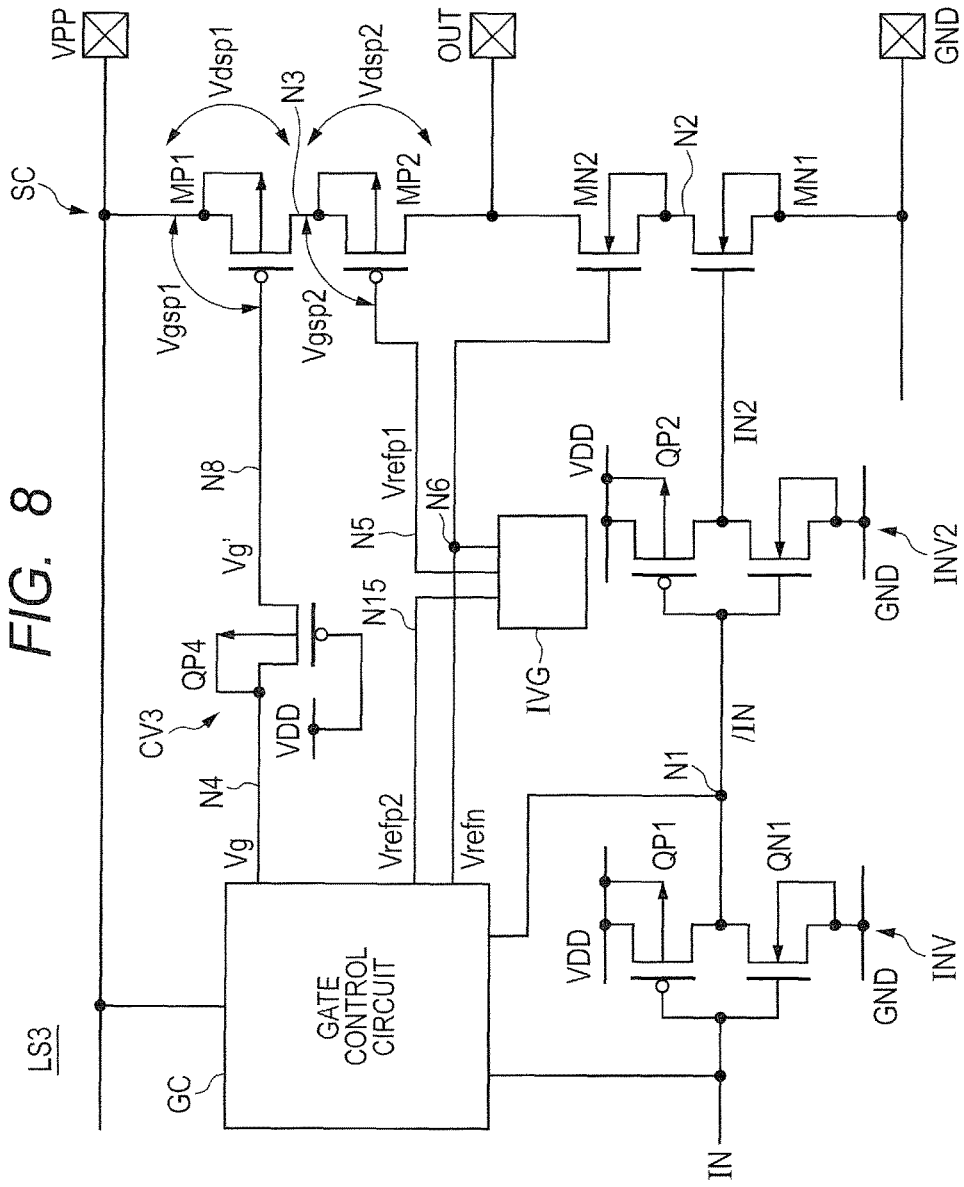
FIG. 8 is a circuit diagram illustrating a level shift circuit according to Embodiment 3.

FIG. 8 is a circuit diagram illustrating a level shift circuit according to Embodiment 3. A level shift circuit LS3 according to Embodiment 3 suppresses the hot carriers of the PMOS transistor. The level shift circuit LS3 is the same as the level shift circuit LSR, except that a potential conversion circuit CV3 is added between the gate control circuit GC and the PMOS transistor MP1. The potential conversion circuit CV3 is comprised of a PMOS transistor QP4 (a PMOS transfer gate), and separates the output potential from the input potential. VDD is applied to a gate of the PMOS transistor QP4, and a substrate electrode of the PMOS transistor QP4 is coupled to the gate of the PMOS transistor MP1 (a node N8). Accordingly, the level of the node N8 lies between (VPP/2 Vtp) and VPP. Therefore, Vgsp1 becomes small and Vdsp1 becomes large. When Vdsp1 becomes large, Vdsp2 becomes small, and the hot carrier degradation of the PMOS transistor MP2 is suppressed. The level shift circuit LS3 is employed for the I/O circuits 54 and 55 of the SoC 51, as in Embodiment 1.

Embodiment 4

Figure 9:
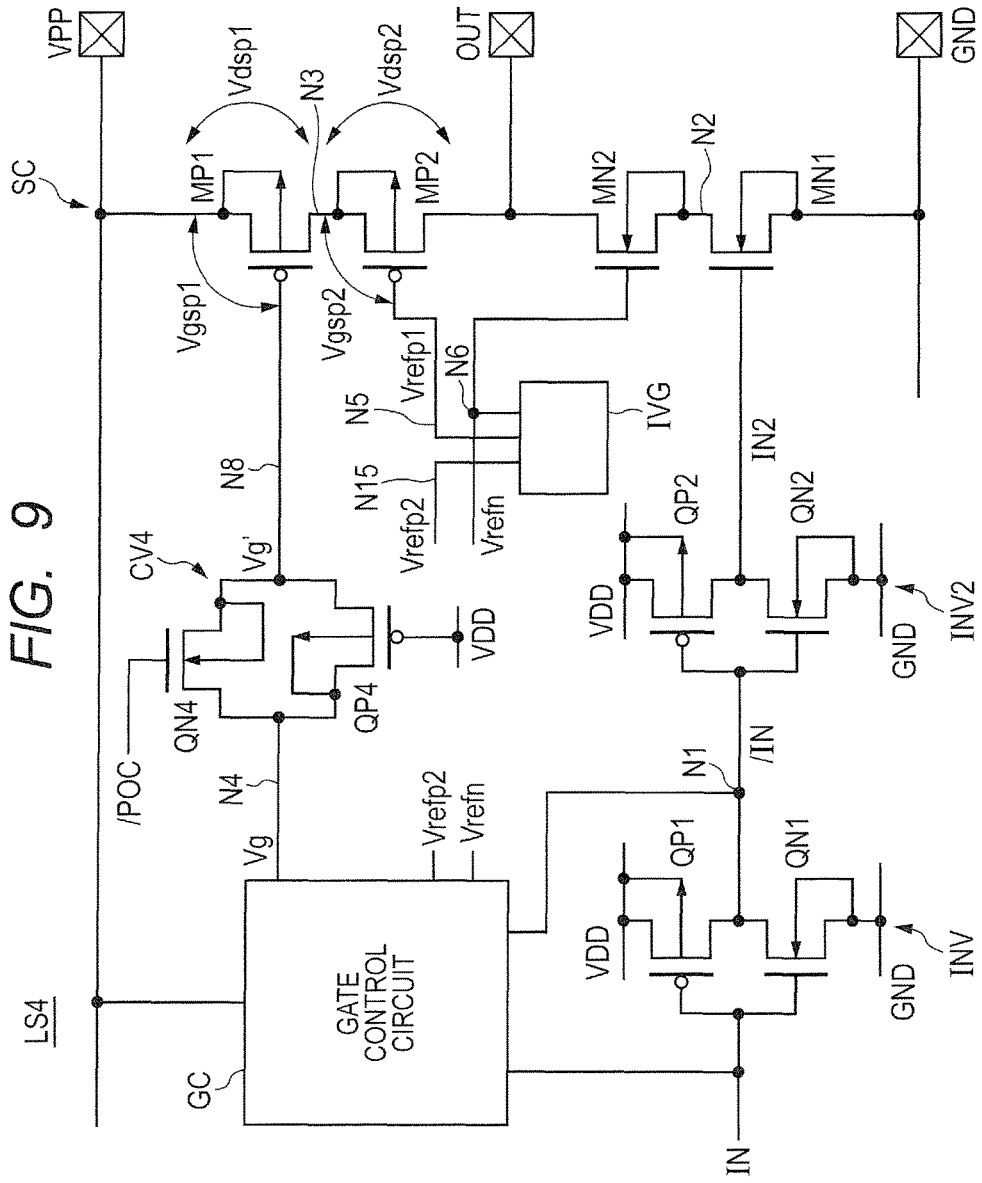
FIG. 9 is a circuit diagram illustrating a level shift circuit according to Embodiment 4.

FIG. 9 is a circuit diagram illustrating a level shift circuit according to Embodiment 4. The level shift circuit LS4 according to Embodiment 4 satisfies both of the suppression of the hot carrier degradation when the high power supply potential (VPP) is high, and the high-speed operation when VPP is low (to the degree not exceeding the withstand voltage of the MOS transistor). The level shift circuit LS4 is the same as the level shift circuit LS3 except for the potential conversion circuit. The potential conversion circuit CV4 includes an NMOS transistor QN4 (an NMOS transfer gate) that is coupled in parallel with the PMOS transistor QP4. A /POC signal is applied to a gate of the NMOS transistor QN4, and a substrate electrode of the PMOS transistor QP4 is coupled to the output (the node N4) of the gate control circuit GC. When VPP is high, the /POC signal is set to "L" (CND) and the NMOS QN4 is turned off. In that case, the circuit operation is the same as that of Embodiment 3, and the "L" level of the node NO becomes as (VPP/2+Vtp); accordingly, the hot carrier degradation of the PMOS transistor MP2 can be suppressed as in Embodiment 3. When VPP is low, the /POC signal is set to "H" (VDD) and the NMOS transistor QN4 is turned on. Accordingly, the "L" level of the node NB becomes as VPP/2 and the amplitude lies between VPP/2 and VPP; accordingly, the high-speed operation becomes possible. The level shift circuit LS4 is employed for the I/O circuits 74 and 75 of the SoC 71, as in Embodiment 2. In this case, the /POC signal is inputted into the I/O circuits 74 and 75.

Embodiment 5

Figure 10:
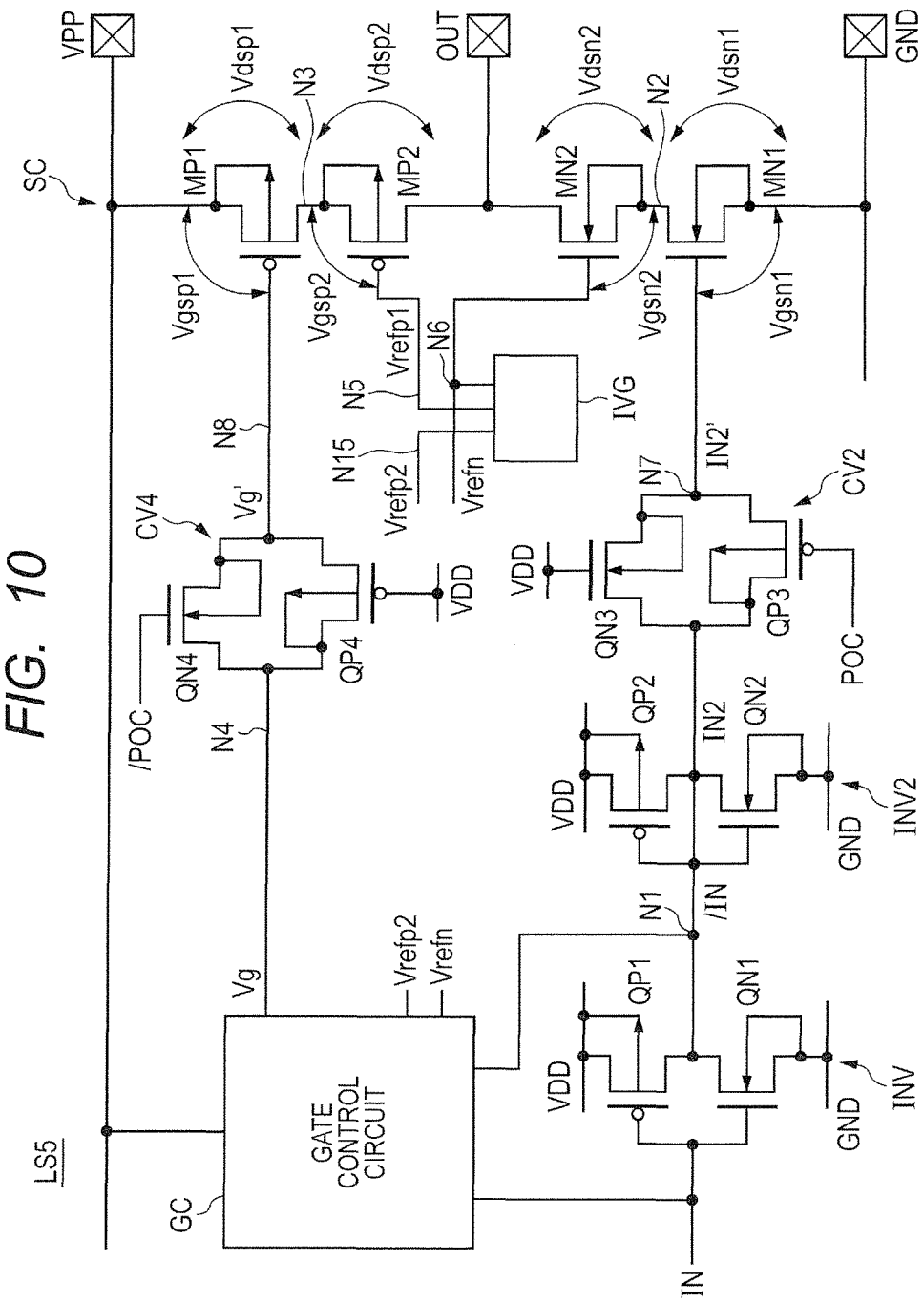
FIG. 10 is a circuit diagram illustrating a level shift circuit according to Embodiment 5.

FIG. 10 is a circuit diagram illustrating a level shift circuit according to Embodiment 5. A level shift circuit LS5 according to Embodiment 5 satisfies both of the suppression of the hot carrier degradation of both the PMOS transistor MP2 and the NMOS transistor MNL when the high power supply potential (VPP) is high, and the high-speed operation when VPP is low (to the degree not exceeding the withstand voltage of the MOS transistor) The level shift circuit LS5 is the circuit that combines Embodiment 2 and Embodiment 4, and the operation is the same as those of Embodiment 2 and Embodiment 4. The level shift circuit LS5 is employed for the I/O circuits 74 and 75 of the SoC 71, as in Embodiment 2. In this case, the POC signal and the /POC signal are inputted into the I/O circuits 74 and 75.

Without employing a transistor of a high withstand voltage structure and preventing an excessive voltage from being applied to a gate oxide layer of a transistor, the embodiments employ the circuit in which a signal of a high amplitude (0 V to VPP) is outputted from the input of a logical signal of a low amplitude (0 V to VDD), with the output section configured with multiple stages of PMOS transistors and multiple stages of NMOS transistors coupled in series, respectively.

In Embodiments 1, 2, and 5, by coupling the transfer gate between the gate of the NMOS transistor and the gate control circuit, Vds (the drain-to-source voltage) applied to each of the vertically stacked NMOS transistors is controlled properly, and the hot carrier degradation of the NMOS transistor is suppressed when the high power supply potential (VPP) is high. At the same time, in Embodiments 2 and 5, the high-speed operation is realized when VPP is low.

In Embodiments 3, 4, and 5, by coupling the transfer gate between the gate of the PMOS transistor and. the gate control circuit, Vds (the drain-to-source voltage) applied to each of the vertically stacked. PMOS transistors is controlled properly, and the hot carrier degradation of the PMOS transistor is suppressed when the high power supply potential (VPP) is high. At the same time, in Embodiments 4 and 5, the high-speed operation is realized when VPP is low.

According to the embodiments it is possible to enhance the reliability of the high voltage output circuit using a low withstand voltage device. It is particularly effective in the most advanced process with miniaturization, which gives rise to remarkable degradation of reliability. Degradation of the transistor performance due to hot carriers becomes remarkable as the process moves toward further miniaturization.

As described above, the invention accomplished by the present inventors has been concretely explained based on the embodiments. However, it cannot be overemphasized that the present invention is not restricted to the embodiments as described above, and it can be changed variously in the range that does not deviate from the gist.

Embodiment 1 and Embodiment 3 may be combined so as to employ both of the potential conversion circuit CV1 and the potential conversion circuit CV3.

Embodiments 1 to 5 are examples of the output driver. However, the same technique can be applied to a circuit in which transistors are vertically stacked similarly and the gate bias is controlled, in order to withstand a high voltage.

What is claimed is:
1. A semiconductor device comprising:
a semiconductor chip including a level shift circuit to output a high amplitude signal from an input of a logical signal,
wherein the level shift circuit comprises:
a series coupling circuit coupled to a second power supply;
a control circuit coupled to the series coupling circuit for controlling the series coupling circuit based on the logical signal; and
a first potential conversion circuit coupled between the series coupling circuit and the control circuit and coupled to a first power supply,
wherein the series coupling circuit comprises:
a plurality of first-channel MOS transistors coupled in series between the second power supply and a reference power supply;
a plurality of second-channel MOS transistors coupled in series between the second power supply and the reference power supply in series with the plurality of first-channel MOS transistors, and
a first output node to which the plurality of first-channel MOS transistors and the plurality of second-channel MOS transistors are coupled,
wherein the plurality of first-channel MOS transistors are coupled between the second power supply and the first output node and the plurality of second-channel MOS transistors are coupled between the first output node and the reference power supply,
wherein the plurality of second-channel MOS transistors includes:
a first second-channel MOS transistor with a source coupled to the reference power supply; and a second second-channel MOS transistor with a source coupled to a drain of the first second-channel MOS transistor,
wherein the control circuit includes
a first gate control circuit coupled to the first power supply,
wherein the first gate control circuit generates a first signal that has an amplitude between a potential of the reference power supply and a potential of the first power supply and that controls a gate of the first second-channel MOS transistor, and
wherein the first potential conversion circuit supplies a first level potential that is lower than a high level of the first signal and higher than the potential of the reference power supply, to the gate of the first second-channel MOS transistor.

2. The semiconductor device according to claim 1, wherein the first-channel MOS transistors comprise P-channel MOS transistors and the second-channel MOS transistors comprise N-channel MOS transistors.

3. The semiconductor device according to claim 2, wherein a substrate of the first N-channel MOS transistor is coupled to the reference power supply, and wherein a substrate of the second N-channel MOS transistor is coupled to the drain of the first N-channel MOS transistor.

4. The semiconductor device according to claim 2,
wherein the first potential conversion circuit supplies a potential higher than the first level potential to the gate of the first N-channel MOS transistor based on a first control signal.

5. The semiconductor device according to claim 2,
wherein the first potential conversion circuit includes a first transfer gate comprised of a third N-channel MOS transistor with a gate coupled to the first power supply, and a substrate of the third N-channel MOS transistor is coupled to a second output node of the first transfer gate.

6. The semiconductor device according to claim 4,
wherein the first potential conversion circuit includes a second transfer gate comprised of a third P-channel MOS transistor with a gate supplied with the first control signal, and a substrate of the third P-channel MOS transistor is coupled to a first input node of the second transfer gate.

7. The semiconductor device according to claim 2,
wherein the first gate control circuit comprises a first inverter circuit to output an inverted signal obtained by inverting an input signal, and a second inverter circuit to output the first signal obtained by inverting the inverted signal.

8. The semiconductor device according to claim 7,
wherein the first inverter circuit comprises a fifth P-channel MOS transistor with a source coupled to the first power supply, a fifth N-channel MOS transistor with a source coupled to the reference power supply, a third input node to which a gate of the fifth P-channel MOS transistor and a gate of the fifth N-channel MOS transistor are coupled, and a fourth output node to which a drain of the fifth P-channel MOS transistor and a drain of the fifth N-channel MOS transistor are coupled, and
wherein the input signal is applied to the third input node and the inverted signal is applied to the fourth output node.

9. The semiconductor device according to claim 2, further comprising:

a potential generating circuit coupled between the control circuit and the series coupling circuit,
wherein the potential generating circuit generates a first potential that is lower than a potential of the second power supply and higher than a potential of the reference power supply and that is applied to a gate of a P-channel MOS transistor among the plurality of P-channel MOS transistors, a second potential that is lower than the potential of the second power supply and higher than the potential of the reference power supply and that is applied to a gate of second N-channel MOS transistor.

10. A semiconductor device comprising:
a semiconductor chip including a level shift circuit to output a high amplitude signal from an input of a logical signal,
wherein the level shift circuit comprises:
a series coupling circuit;
a control circuit coupled to the series coupling circuit for controlling the series coupling circuit based on the logical signal; and
a first potential conversion circuit coupled between the control circuit and the series coupling circuit,
wherein the series coupling circuit comprises:
a plurality of first-channel MOS transistors coupled in series;
a plurality of second-channel MOS transistors coupled in series in series with the plurality of first-channel MOS transistors; and
a first output node to which the plurality of first-channel MOS transistors and the plurality of second-channel MOS transistors are coupled,
wherein the plurality of second-channel MOS transistors includes:
a first second-channel MOS transistor with a source coupled to a reference power supply; and
a second second-channel MOS transistor with a source coupled to a drain of the first second-channel MOS transistor,
wherein the control circuit includes
a first gate control circuit,
wherein the first gate control circuit generates a first signal that controls a gate of the first second-channel MOS transistor, and
wherein the first potential conversion circuit supplies a first level potential that is lower than a high level of the first signal to the gate of the first second-channel MOS transistor.

11. The semiconductor device according to claim 10, wherein the first-channel MOS transistors comprise P-channel MOS transistors and the second-channel MOS transistors comprise N-channel MOS transistors.

12. The semiconductor device according to claim 11,
wherein a substrate of the first N-channel MOS transistor is coupled to the reference power supply, and
wherein a substrate of the second N-channel MOS transistor is coupled to the drain of the first N-channel MOS transistor.

13. The semiconductor device according to claim 11,
wherein the first potential conversion circuit supplies a potential higher than the first level potential to the gate of the first N-channel MOS transistor based on a first control signal.

14. The semiconductor device according to claim 11,
wherein the first potential conversion circuit includes a first transfer gate comprised of a third N-channel MOS transistor with a gate coupled to the first power supply, and a substrate of the third N-channel MOS transistor is coupled to a second output node of the first transfer gate.

15. The semiconductor device according to claim 13, wherein the first potential conversion circuit includes a second transfer gate comprised of a third P-channel MOS transistor with a gate supplied with the first control signal, and a substrate of the third P-channel MOS transistor is coupled to a first input node of the second transfer gate.

16. The semiconductor device according to claim 11, wherein the first gate control circuit comprises a first inverter circuit to output an inverted signal obtained by inverting an input signal, and a second inverter circuit to output the first signal obtained by inverting the inverted signal.

17. The semiconductor device according to claim 16, wherein the first inverter circuit comprises a fifth P-channel MOS transistor with a source coupled to the first power supply, a fifth N-channel MOS transistor with a source coupled to the reference power supply, a third input node to which a gate of the fifth P-channel MOS transistor and a gate of the fifth N-channel MOS transistor are coupled, and a fourth output node to which a drain of the fifth P-channel MOS transistor and a drain of the fifth N-channel MOS transistor are coupled, and
wherein the input signal is applied to the third input node and the inverted signal is applied to the fourth output node.

18. The semiconductor device according to claim 11, further comprising:
a potential generating circuit coupled between the control circuit and the series coupling circuit,
wherein the potential generating circuit generates a first potential that is applied to a gate of a P-channel MOS transistor among the plurality of P-channel MOS transistors, a second potential that is applied to a gate of second N-channel MOS transistor.

19. A level shift circuit for a semiconductor chip to output a high amplitude signal from an input of a logical signal, the level shift circuit comprising:
a coupling circuit coupled to a second power supply;
a control circuit coupled to the coupling circuit for controlling the coupling circuit based on the logical signal; and
a first potential conversion circuit coupled between the coupling circuit and the control circuit and coupled to a first power supply,
wherein the coupling circuit comprises:
a plurality of first-channel MOS transistors coupled between the second power supply and a reference power supply;
a plurality of second-channel MOS transistors coupled between the second power supply and the reference power supply with the plurality of first-channel MOS transistors, and
a first output node to which the plurality of first-channel MOS transistors and the plurality of second-channel MOS transistors are coupled,
wherein the plurality of first-channel MOS transistors are coupled between the second power supply and the first output node and the plurality of second-channel MOS transistors are coupled between the first output node and the reference power supply,
wherein the plurality of second-channel MOS transistors includes:
a first second-channel MOS transistor with a source coupled to the reference power supply; and
a second second-channel MOS transistor with a source coupled to a drain of the first second-channel MOS transistor,
wherein the control circuit includes
a first gate control circuit coupled to the first power supply, wherein the first gate control circuit generates a first signal that has an amplitude between a potential of the reference power supply and a potential of the first power supply and that controls a gate of the first second-channel MOS transistor, and
wherein the first potential conversion circuit supplies a first level potential that is lower than a high level of the first signal, to the gate of the first second-channel MOS transistor.

20. The level shift circuit according to claim 19, wherein the first-channel MOS transistors comprise P-channel MOS transistors and the second-channel MOS transistors comprise N-channel MOS transistors,
wherein a substrate of the first N-channel MOS transistor is coupled to the reference power supply, and
wherein a substrate of the second N-channel MOS transistor is coupled to the drain of the first N-channel MOS transistor.

* * * * *